(12) United States Patent
Madsen et al.

(10) Patent No.: US 7,650,546 B2
(45) Date of Patent: Jan. 19, 2010

(54) FLEXIBLE JTAG ARCHITECTURE

(75) Inventors: John Madsen, Ottawa (CA); Dion Pike, Stittsville (CA); Richard Grieve, Ottawa (CA)

(73) Assignee: Alcatel Lucent, Paris (FR)

( * ) Notice: Subject to any disclaimer, the term of this patent is extended or adjusted under 35 U.S.C. 154(b) by 661 days.

(21) Appl. No.: 11/378,839

(22) Filed: Mar. 17, 2006

(65) Prior Publication Data
US 2007/0219032 A1 Sep. 20, 2007

(51) Int. Cl.
*G01R 31/28* (2006.01)
(52) U.S. Cl. ...................... 714/726; 714/729
(58) Field of Classification Search ......... 714/724–727, 714/733, 734, 30, 37; 716/4
See application file for complete search history.

(56) References Cited

U.S. PATENT DOCUMENTS

| 5,862,152 A * | 1/1999 | Handly et al. ............... 714/727 |
| 6,886,110 B2 * | 4/2005 | O'Brien ....................... 714/34 |
| 2003/0163773 A1 * | 8/2003 | O'Brien et al. ............. 714/726 |
| 2004/0210805 A1 * | 10/2004 | Kimelman et al. .......... 714/724 |
| 2006/0195739 A1 * | 8/2006 | O'Brien ....................... 714/727 |

* cited by examiner

*Primary Examiner*—Phung M. Chung
(74) *Attorney, Agent, or Firm*—Smart & Bigger

(57) ABSTRACT

A circuit comprises two or more chains of components, each chain comprising a plurality of components serially connected by designated pins on each component and at least one chain including one or more components of another chain, the designated pins being designated for data for one or more specific purposes. A selector is included for selecting one chain from the two or more chains over which to data is to be sent. Another circuit comprises a chain of components serially connected by designated pins on each component, and two or more controllers, each controller capable of controlling the chain for one or more of the specific purposes. A wiring board for implementing the circuit is also provided.

19 Claims, 7 Drawing Sheets

US 7,650,546 B2

FLEXIBLE JTAG ARCHITECTURE

FIELD OF THE INVENTION

The present invention relates to a selector for selecting one of a plurality of chains of components, a circuit comprising the selector and chains, and a wiring board for implementing the circuit.

BACKGROUND

Existing networking equipment cards have components that are JTAG (Joint Test Group Action Group) compliant, i.e. meet the requirements of IEEE Standard 1149.1. There are many uses for the chain of components created when JTAG compliant components are assembled together. For example, they can be used for programming devices such as Lattice clock drivers; programming serial EEPROM (Electrically Erasable Programmable Read-Only Memory) and FPGAs (Field Programmable Gate Arrays), both during manufacturing and while in service; CT (Combinational Testing) and interconnect testing during manufacturing; and ILA (Integrated Logic Analyzer) debug access to FPGAs.

One of the challenges in creating a JTAG architecture is that the preferred length of the chain and its starting and stopping point is different depending on the application. A chain which involves all of the JTAG components on a card is required for some manufacturing testing. However, for some applications, only some of the JTAG components may be required. Using a long chain that includes all of the JTAG components may limit the application by the restrictions of the components unnecessary to the application. For example, a component unnecessary to the application may run at slower speed than the necessary components or may be corrupted.

Furthermore, one standard chain structure may not satisfy all needs. In particular, using only one chain may not be the better option for the different functions that can be performed. For example, a shorter chain is more efficient for programming and ILA, while a long chain involving all components is better for testing. Furthermore, different applications may require different chain structures. For example, interconnect testing requires that the chain be controlled with external equipment connected through a header, while in-service upgrades of an EEPROM requires that the chain be controlled locally.

SUMMARY OF THE INVENTION

Accordingly, in one aspect of the present invention, there is provided a circuit comprising: two or more chains of components, each chain comprising a plurality of components serially connected by designated pins on each component and at least one chain including one or more components of another chain, the designated pins being designated for data for one or more specific purposes; and a selector for selecting one chain from the two or more chains over which data is to be sent.

In a second aspect of the present invention, there is provided a circuit comprising: a first chain of components serially connected by designated pins on each component, the designated pins being designated for data for one or more specific purposes; and two or more controllers, each controller capable of controlling the chain for one or more of the specific purposes.

In a third aspect of the present invention, there is provided a wiring board, comprising: slots for a plurality of components; two or more serial circuits, each serial circuit connecting slots for two or more components in series through designated pin positions on each slot and one circuit including one or more slots from another circuit; and a selector slot for a selector for selecting one of the serial circuits over which data is to be sent.

Embodiments of the present invention make more efficient use of JTAG chains by enabling a selection between more than one JTAG chain of different lengths and allowing more than one device to control a JTAG chain.

Other aspects and features of the present invention will become apparent, to those ordinarily skilled in the art, upon review of the following description of specific embodiments of the invention.

Examples of embodiments of the invention will now be described in greater detail with reference to the accompanying drawings, in which:

DETAILED DESCRIPTION OF THE PREFERRED EMBODIMENTS

Figure 1:
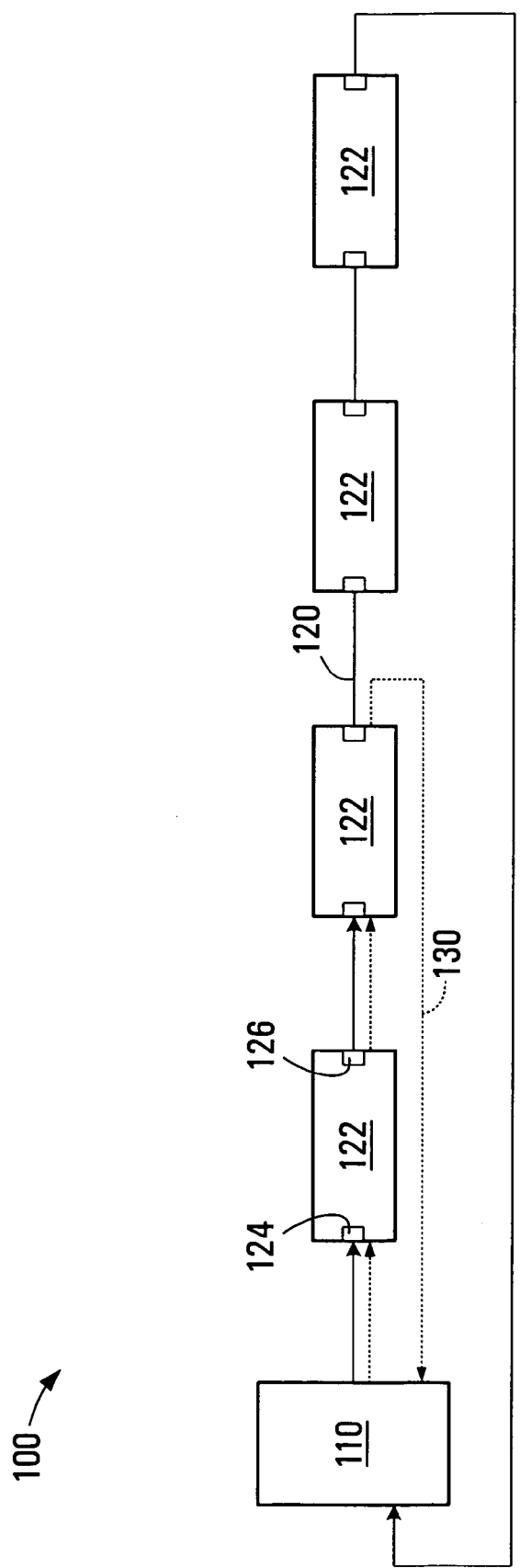
FIG. 1 is a block diagram of a circuit according to one embodiment of the present invention.

Referring to FIG. 1, one embodiment of the present invention is a circuit 100 comprising two or more chains 120 and 130 and a selector 110 for selecting one of the chains 120 or 130 over which to send data. While FIG. 1 depicts two chains, there may be more than two chains in other embodiments of the invention. Each chain 120 and 130 comprises a plurality of components 122. The components 122 of each chain 120 and 130 are serially connected within the chain by designated pins, the pins being designated for data for one or more specific purposes. For example, the components 122 receive data at pin 124 and output the data at pin 126 to the next component. The components of the chain 130 include two of the components of the chain 120. In FIG. 1, the chain 130 is a subset of the chain 120, although, other chains may exist that are not subsets of each other. Non-limiting examples of purposes for which the designated pins may be used are combinational testing, interconnect testing, analysis, debugging, and programming.

In a particular embodiment of the invention, the chains 120 and 130 are JTAG chains. In such embodiments, at least one of the components 122 may be compliant with IEEE Standard 1149.1. Generally, all devices on a JTAG chain need some minimal level of compliance.

Some embodiments of the present invention provide different JTAG chains for different purposes and a way of selecting which chain to use.

In some embodiments, the selector 110 is located on a connector device, such as a header, for which the pins can be programmed. An example of a connector device on which the selector may be located is a 2×10 header. In operation, the selector 110 receives an input control signal, the input indicating that a specific chain is to be used. In response, the selector outputs an output signal, which results in the specific chain being used.

Figure 2:
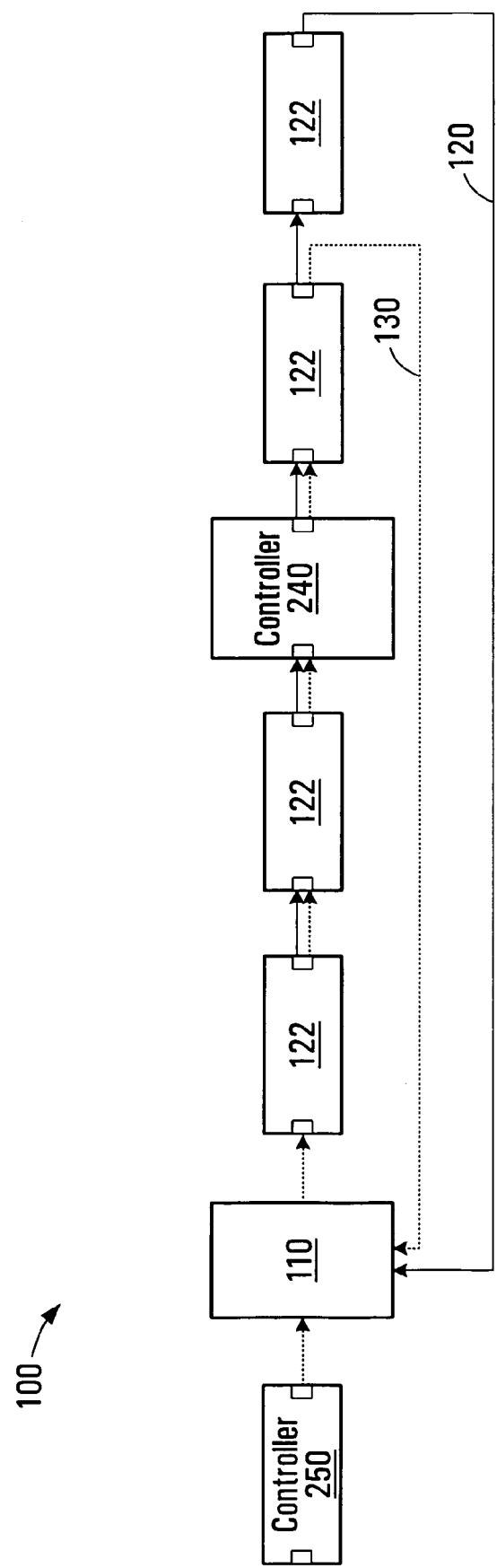
FIG. 2 is a block diagram of a circuit according to one embodiment of the present invention.

FIG. 2 is a block diagram of a circuit 200 according to one embodiment of the invention in which at least one of the chains can be controlled by any one of a plurality of controllers. The circuit of FIG. 2 is the same as the circuit described with reference to FIG. 1, except that chain 130 includes a controller 240 that is serially connected to the components 122 in that chain and a controller 250 that is connected to the circuit via the selector 110. In this embodiment, the chain 130 can be controlled by either the external source 250 via the selector 110 or by controller 240. The controllers 240 and 250 are any devices that have controlling functionality. Examples of devices that can be a controller are a FPGA, a processor, and a dedicated JTAG controller accessible through a processor interface. For example, in a circuit according to an embodiment of the present invention with a plurality of JTAG chains, a FPGA in one of the JTAG chains can be given a command to send data over that JTAG chain to program a component on that chain.

In some embodiments, one chain has fewer components than another chain. Thus, if only the components of the shorter chain are required for a specific function, the shorter chain can be used. This results in the specific function being carried out faster than if a longer chain is used. In addition, using a chain with fewer components reduces the risk of failure of the function due to corruption, such as incorrect or unexpected behaviour of one of the components.

In some embodiments, the circuit 100 or 200 also comprises a director for directing the data over the selected chain. In some embodiments, the director comprises one or more multiplexers, which receive(s) a signal from the selector, as well as the data that is to be sent, and directs the data to the chain that corresponds to the signal. In other embodiments, the director comprises one or more switches.

Figure 3:
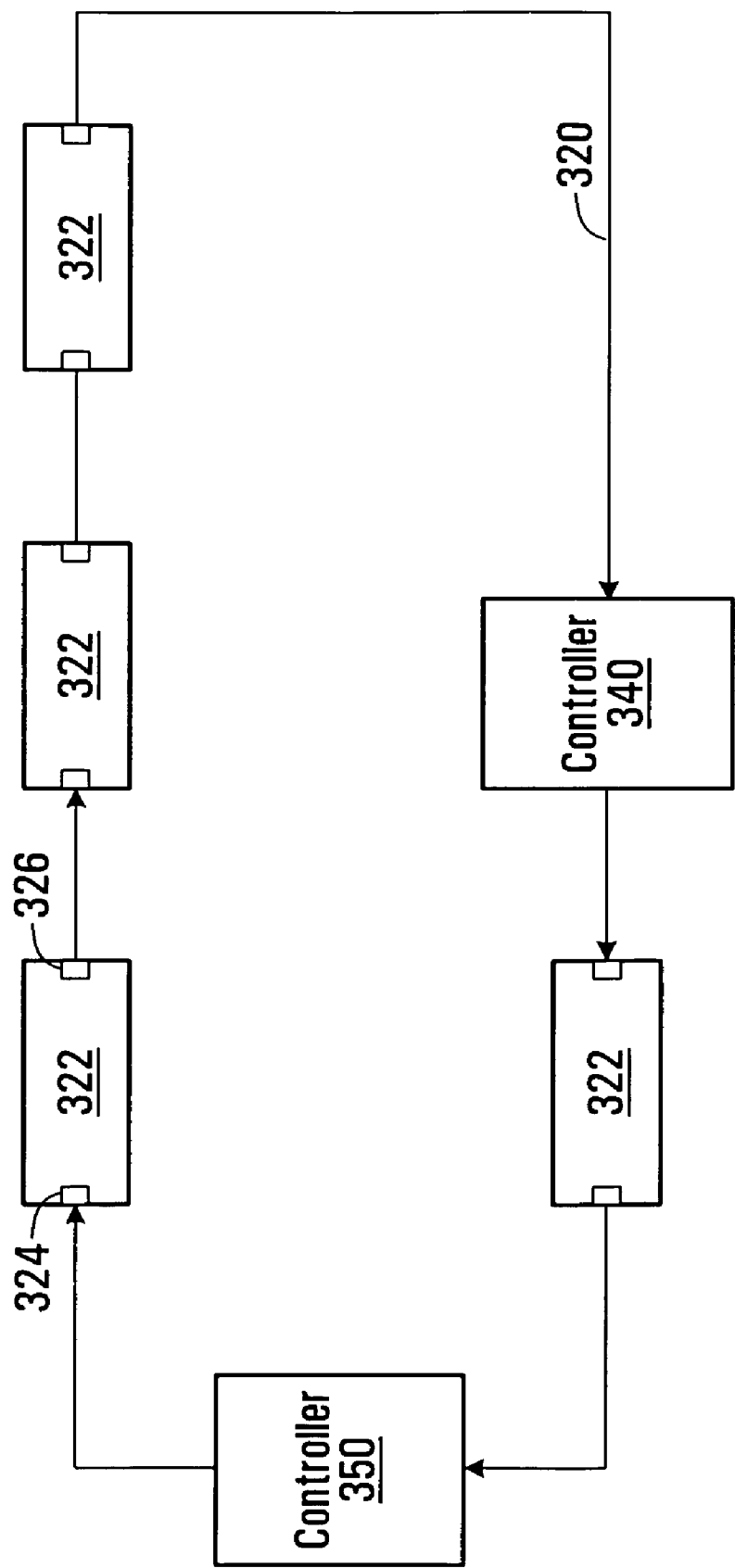
FIG. 3 is a block diagram of a circuit according to one embodiment of the present invention.

Another circuit according to an embodiment of the present invention will now be described with reference to FIG. 3. A circuit 300 comprises a chain 320 of components 322 serially connected by designated pins 324 and 326 on each component. The components 322 are similar to the components 122 described with reference to FIGS. 1 and 2 and therefore will not be described further. The circuit 300 also comprises two or more controllers 340 and 350, each controller being capable of controlling the chain for one or more specific purposes for which the designated pins carry data.

In some embodiments, the chain 320 comprises at least one of the controllers 340 or 350, the controller being serially connected to the components. A controller may also be an external source connected to the circuit via a selector, such as a connector device. For example, the controller 250 described with reference to FIG. 2 is connected to circuit 230 via selector 110.

The controllers 340 and 350 are any device capable of controlling the circuit 320, such an FPGA; a processor; and a dedicated JTAG controller.

As with the previously described chains, in some embodiments, the chain 320 is a JTAG chain.

In a particular embodiment, the circuit 300 further comprises a plurality of chains of components, each chain comprising a plurality of components serially connected by designated pins on each component. At least one of the chains includes one or more components of another chain, and one of the chains in the plurality of chains is the chain 320. In this embodiment, the circuit 300 also comprises a selector for selecting one chain from the plurality of chains over which data is to be sent.

Figure 4:
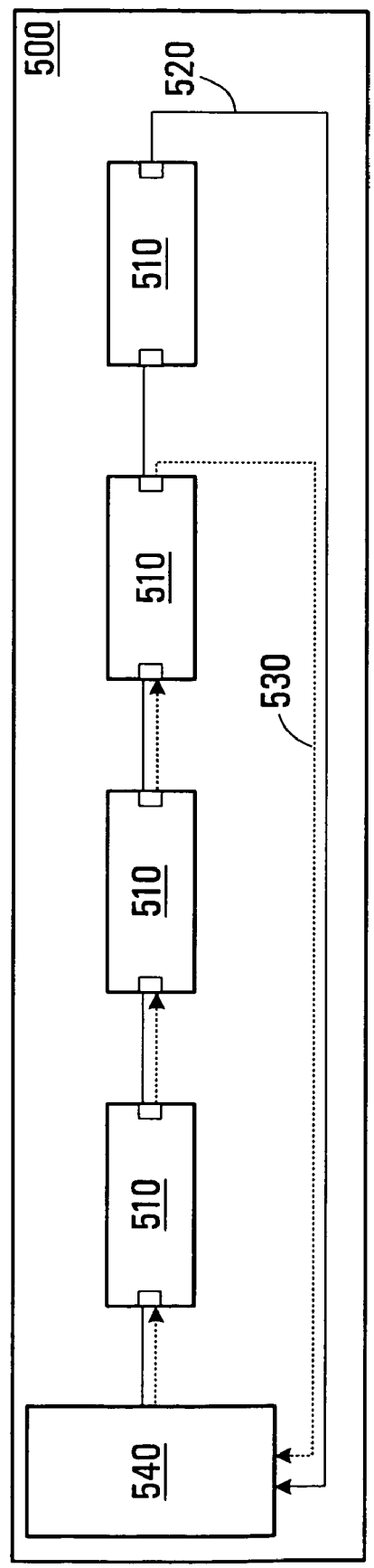
FIG. 4 is a block diagram of a wiring board according to one embodiment of the present invention.

An another aspect of the invention is a wiring board, an example of which will now be described with reference to FIG. 4. A wiring board 500 comprises slots 510 for a plurality of components, two or more serial circuits 520 and 530 and a selector slot 540 for a selector. Each serial circuit 520 and 530 connects slots 510 for two or more components in series through designated pin positions on each slot 510 and one circuit includes one or more slots of another circuit. The selector slot 540 is for a selector for selecting one of the serial circuits 520 or 530 over which data is to be sent. The wiring board 500 can be used for any of the circuits described herein. In some embodiments, the selector slot 540 comprises positions for an input pin for receiving a signal to send data over a selected circuit from the two or more circuits and an output pin for directing the data over the selected circuit.

Figure 5A:
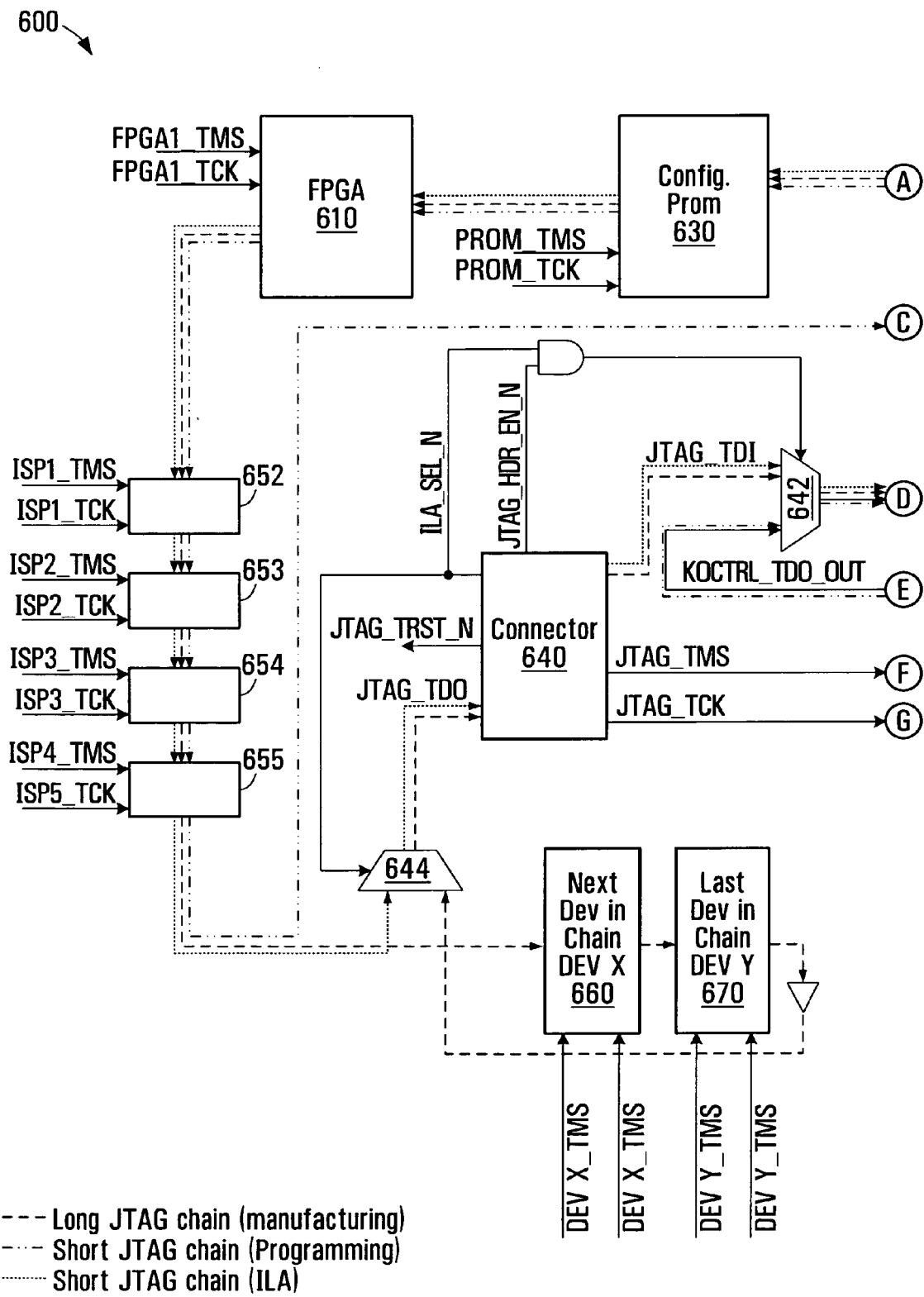
FIGS. 5A and 5B in combination are a circuit diagram of a circuit according to one embodiment of the present invention.
Figure 5B:
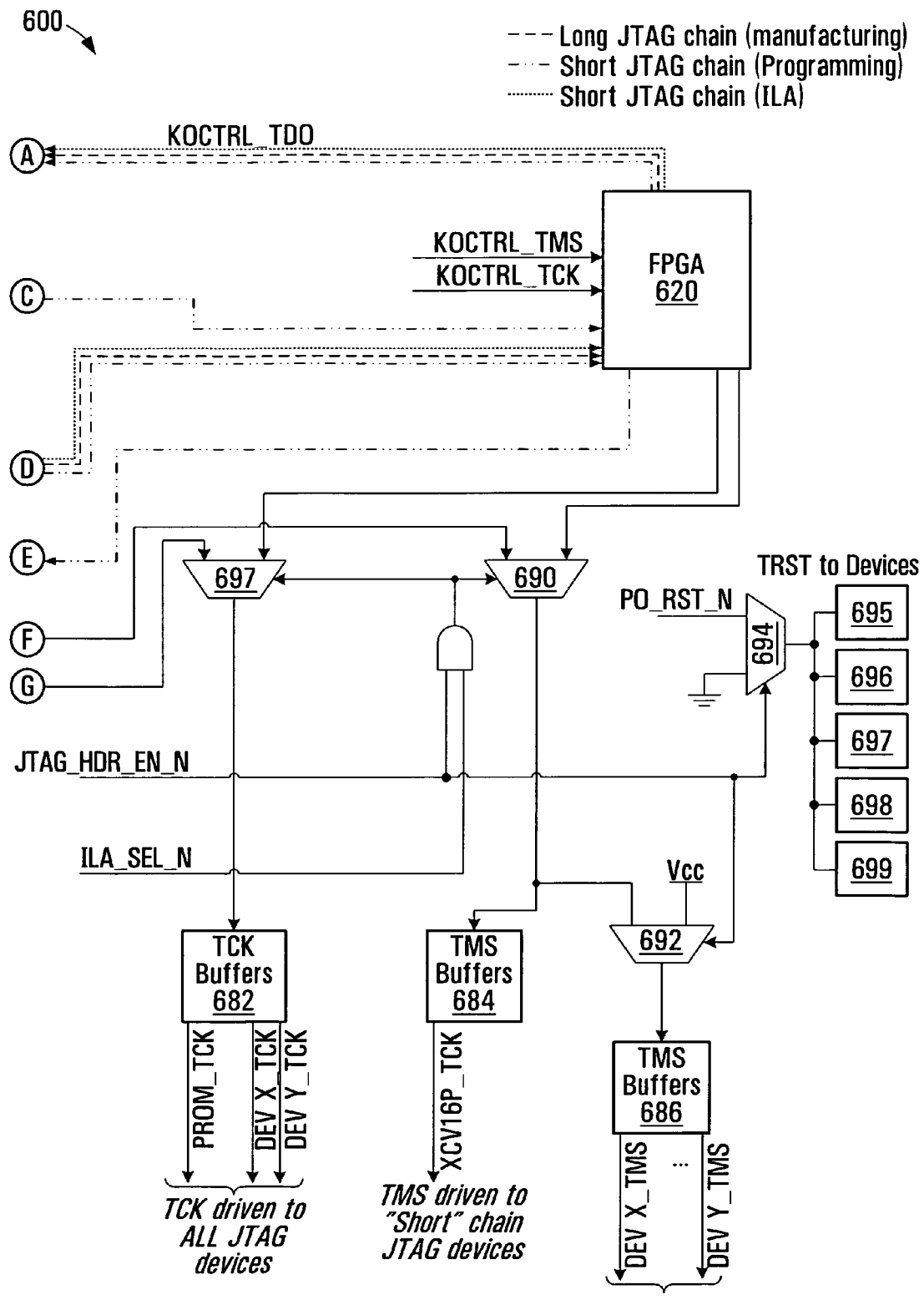

A specific implementation of the present invention will now be described with reference to FIGS. 5A and 5B. A circuit 600 comprises two chains, a long chain and a short chain. The short chain in this example is a subset of the long chain. The short chain may be controlled internally by an FPGA 620 or externally via a connector 640. The long chain is comprised of the FPGA 620, a configurable PROM (Programmable Read Only Memory) 630, another FPGA 610, four JTAG-programmable clock synthesisers 652, 653, 654, and 655, and Device X 660 and Device Y 670. The short chain is comprised of the two FPGAs 610 and 620, the PROM 630, and the four JTAG-programmable clock synthesisers 652, 653, 654, and 655. In a specific embodiment, the clock synthesisers are ISP5510s, but they can be any JTAG-programmable clock synthesisers.

In operation, data is sent from the connector 640 or from the FPGA 620 to a multiplexer 642, where it is forwarded to a TDI (Test Data In) pin on the first component of the chain that is selected. The multiplexer 642 is driven by an output from the connector 640, which indicates which chain is to be used, the output is based on an input signal that is received from an external source. A multiplexer 644 is also driven by the output of the connector 640 to select the data from a TDO (Test Data Out) pin of the last component in each chain before completing the circuit at the connector.

In a specific example, the output of the connector 640 is comprised of signals on two select pins, ILA_SEL_N and JTAG_HDR_EN_N. A user can assign a value of 0 or 1 to each of these pins. Each combination of different values on these select pins indicates a specific chain to be used. In cases when the FPGA 620 is to control the short chain, no values are assigned to the select pins on the connector 640. Therefore, a default output signal indicates that the short chain is to be used.

The output also drives three other multiplexers 690 and 697. The multiplexer 690 combines TMS (Test Mode Select) signals from the connector 640 and the FPGA 620 and sends a signal to activate appropriate TMS buffers. If the short chain is selected, TMS buffers 684 are used to send TMS signals to all JTAG devices in the short chain. If the long chain is selected, TMS buffers 684 are used to send TMS signals to all JTAG devices in the short chain and TMS buffers 686 are used to send TMS signals to all other JTAG devices on the long chain. A TMS multiplexer 692 is also used to drive JTAG TMS signals to the devices in the long chain, when required, i.e. during interconnect testing. During normal operation these TMS signals may be idle since some JTAG devices do not operate correctly when TMS toggles.

A TRST multiplexer 694 is used to drive TRST (Test Reset) signals to all JTAG devices 695, 696, 697, 698, and 699 requiring this signal and allows for non-compliant behaviour with respect to TRST. During normal operation TRST to all devices is held low and the JTAG circuitry within each device is disabled. This is not necessary in all applications, but some devices will not operate correctly otherwise. During interconnect testing TRST is high and the JTAG circuitry is enabled.

Another multiplexer 697 combines TCK (Test Clock) signals from the connector 640 and the FPGA 620 and sends a signal to TCK buffers 682 to send TCK signals to all JTAG devices.

Figure 6:
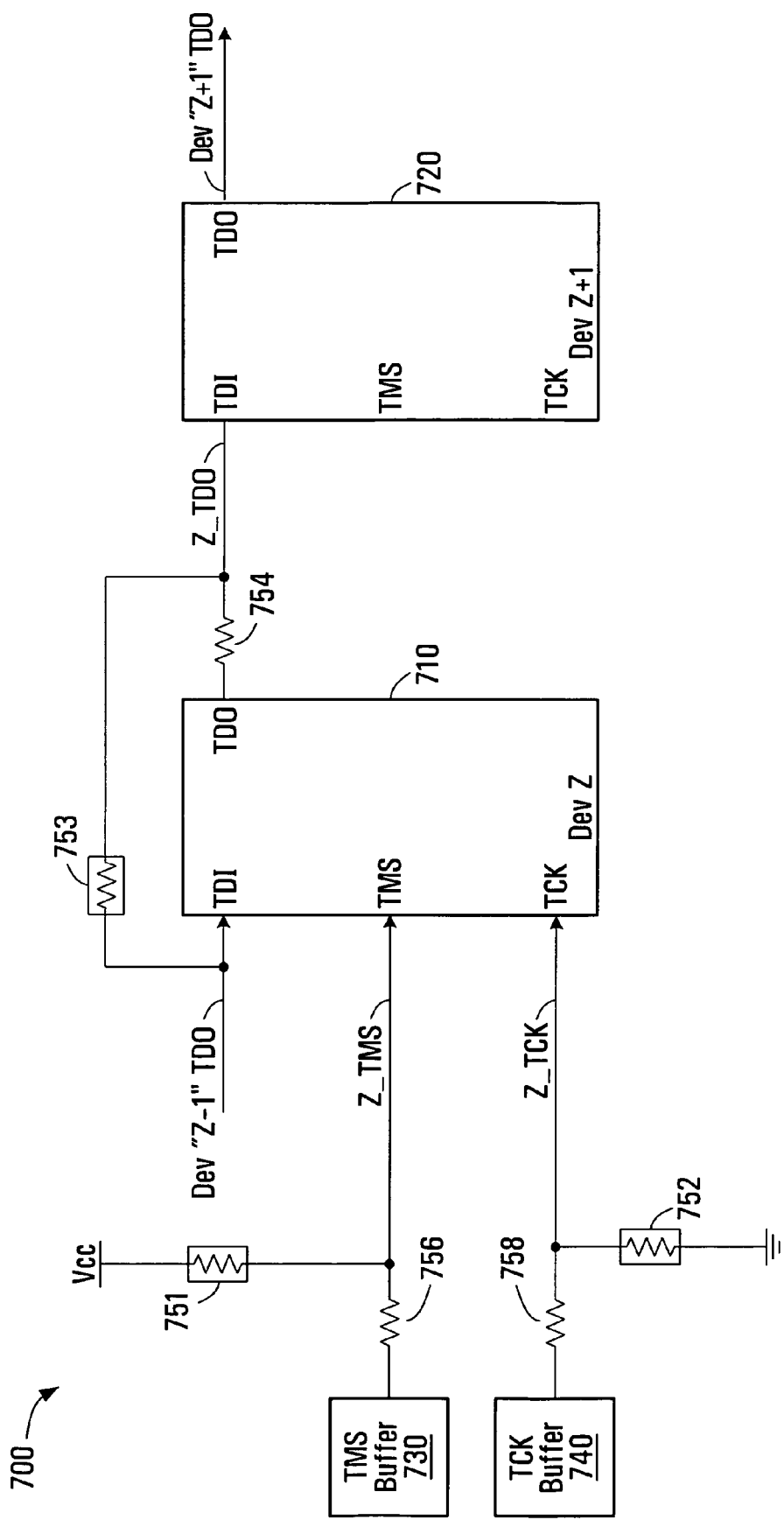
FIG. 6 is a circuit diagram of a bypass circuit used in some embodiments of the present invention.

It is sometimes useful to by-pass a component in a chain in some embodiments of the present invention. FIG. 6 is a circuit diagram of an example of a circuit 700 that can be used to bypass a device 710 in accordance with one embodiment of the present invention. In this example, the chain is a JTAG chain and the device 710 to be by-passed is not JTAG compliant. In some cases, a component is found to be non-compliant after it is inserted into a JTAG chain or after a circuit board is built and therefore, it is necessary to create a circuit to by-pass this component when the JTAG chain is used.

The circuit 700 comprises the device 710 generically labelled Device Z that is part of a JTAG chain. Bypass resistors 753 and 754 are provided to eliminate the device 710 from the chain. The resistor 753 (with the box around it in FIG. 7) is attached to the TDI signal of the device 710 and the resistor 754 (with no box around it in FIG. 7) is attached to the TDO signal of the device 710. The resistor 753 connects at its second end to the end of resistor 754. To bypass device 710, resistor 753 would be stuffed and the resistor 754 would be unstuffed so that a device before it in the chain (Dev Z−1) would connect directly to a device 720 ahead of it in the chain (Dev Z+1). Concurrently, a pull-up resistor 751 on the TMS signal from a TMS Buffer 730 and a pull-down resistor 752 on the TCK signal from a TCK buffer 740 would be stuffed; and series resistors 756 and 758 on the TMS and TCK signals respectively would be unstuffed so that JTAG chain activity is not seen on the device 710 pins.

Advantageously, in embodiments of the present invention, integrating different functions within a single chain can minimize the number of connectors on a board. For example, incorporating ILA and interconnect testing on a board currently can involve separate chains with separate connectors. In addition, time spent verifying correct operation can be minimized with a single consolidated chain with different controllers simply because verifying correct operation in one application, for example functional testing, largely verifies correct operation of other applications.

What has been described is merely illustrative of the application of the principles of the invention. Other arrangements and methods can be implemented by those skilled in the art without departing from the spirit and scope of the present invention.

The invention claimed is:

1. A circuit comprising:
   two or more chains of components, each chain comprising a plurality of components serially connected by designated pins on each component and at least one chain including one or more components of another chain of the two or more chains, the designated pins being designated for data for one or more purposes; and
   a selector for selecting one chain from the two or more chains over which data is to be sent.

2. The circuit of claim 1, wherein at least one of the two or more chains is controllable by any one of a plurality of controllers.

3. The circuit of claim 1, wherein at least one of the two or more chains is a JTAG (Joint Test Action Group) chain.

4. The circuit of claim 3, wherein one or more component in the at least one chain is compliant with IEEE Standard 1149.1.

5. The circuit of claim 3, comprising a multiplexer for directing TMS (Test Mode Select) signals to the components of the selected chain.

6. The circuit of claim 1, comprising a director for directing the data to the selected chain.

7. The circuit of claim 6, wherein the director comprises one or more multiplexers.

8. The circuit of claim 1, further comprising a bypass circuit for bypassing a component.

9. The circuit of claim 1, wherein one of the two or more chains comprises fewer components than another of the two or more chains.

10. The circuit of claim 1, further comprising a circuit board on which the components are mounted.

11. The circuit of claim 1, wherein the selector for selecting the chain over which data is to be sent is located on a connector device.

12. The circuit of claim 1, wherein the purposes are selected from a group consisting of: combinational testing; interconnect testing; programming; analysis; and debugging.

13. A circuit comprising:
   a first chain of components serially connected by designated pins on each component, the designated pins being designated for data for one or more purposes;
   two or more controllers connected to the first chain, wherein the first chain is controllable by each controller for one or more of the purposes;
   a plurality of chains of components, each chain comprising a plurality of components serially connected by designated pins on each component and at least one chain including one or more components of another chain of the plurality of chains, the plurality of chains including the first chain; and
   a selector for selecting one chain from the plurality of chains over which data is to be sent.

14. The circuit of claim 13, wherein the first chain comprises at least one of the controllers, the controller being serially connected to the components.

15. The circuit of claim 13, wherein at least one of the controllers is an external source connected to the first chain via a connector device.

16. The circuit of claim 13, wherein the controllers are selected from a group consisting of an FPGA (Field Programmable Gate Array); a processor; and a dedicated JTAG (Joint Test Action Group) controller.

17. The circuit of claim 13, wherein the first chain is a JTAG (Joint Test Action Group) chain.

18. A wiring board, comprising:
   slots for a plurality of components;
   two or more serial circuits, each serial circuit connecting slots for two or more components in series through designated pin positions on each slot and one circuit of the two or more serial circuits including one or more slots from another circuit of the two or more serial circuits; and
   a selector slot for a selector for selecting one of the two or more serial circuits over which data is to be sent.

19. The wiring board of claim 18, wherein the selector slot comprises positions for an input pin for receiving a signal to send data over a selected serial circuit from the two or more serial circuits and an output pin for directing the data over the selected chain.

* * * * *

UNITED STATES PATENT AND TRADEMARK OFFICE
CERTIFICATE OF CORRECTION

PATENT NO. : 7,650,546 B2
APPLICATION NO. : 11/378839
DATED : January 19, 2010
INVENTOR(S) : Madsen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 969 days.

Signed and Sealed this

Twenty-eighth Day of December, 2010

David J. Kappos
*Director of the United States Patent and Trademark Office*